US005668349A

United States Patent [19]
Durham et al.

[11] Patent Number: 5,668,349
[45] Date of Patent: Sep. 16, 1997

[54] HYDROGEN VENT FOR REMOTE TERMINAL CABINETS

[75] Inventors: James H. Durham, Reston; Wilfred L. Gleadall, Leesburg; Richard A. Carmichael, Manasass; Ray E. Medcalf, Chantilly, all of Va.

[73] Assignee: Hubbell Incorporated, Orange, Conn.

[21] Appl. No.: 588,198

[22] Filed: Jan. 18, 1996

[51] Int. Cl.$^6$ .................................................. H05K 5/02
[52] U.S. Cl. .................... 174/17 VA; 220/202; 429/82
[58] Field of Search ........................... 174/17 VA, 17 R, 174/50; 220/202, 230.01, 203.02, 203.03, 361; 312/213; 429/82, 89; 137/78.5

[56] References Cited

U.S. PATENT DOCUMENTS

| 1,056,842 | 3/1913 | Sharp | 220/203.03 |
|---|---|---|---|
| 1,165,100 | 12/1915 | Holland . | |
| 1,514,670 | 11/1924 | Melchior . | |
| 1,818,249 | 8/1931 | Groble | 220/367.1 |
| 3,625,389 | 12/1971 | Bartlow | 220/3 |
| 3,694,566 | 9/1972 | Thompson et al. | 174/135 |
| 3,832,833 | 9/1974 | Cox | 55/378 |
| 3,984,947 | 10/1976 | Patry | 52/1 |
| 4,184,414 | 1/1980 | Jarnot | 98/37 |
| 4,506,562 | 3/1985 | Yamaura et al. | 74/606 R |
| 5,001,022 | 3/1991 | Wheadon | 429/53 |

FOREIGN PATENT DOCUMENTS

| 2353150 | 1/1978 | France | 174/50 X |
|---|---|---|---|
| 1320864 | 6/1973 | United Kingdom | 220/203.01 X |

OTHER PUBLICATIONS

Drawing of hydrogen vent for Pulsecom Model 7100 remote terminal cabinet (Aug. 1995).
Drawing of hydrogen vent for Pulsecom Model 5192 and 596 remote terminal cabinet (Mar. 1993).

*Primary Examiner*—Kristine L. Kincaid
*Assistant Examiner*—Dean A. Reichard
*Attorney, Agent, or Firm*—Jerry M. Presson; John E. Holmes

[57] ABSTRACT

A roof vent for preventing the buildup of hydrogen gas produced by battery charging in a remote digital telephone cabinet is provided with a movable splash guard for blocking the vent outlet when impinged upon by water and/or wind, thereby preventing the entry of water into the cabinet. The vent also includes a weatherproof cover whose lower edge is formed with scallops or undulations to maintain air gaps between the cover and the cabinet roof.

20 Claims, 2 Drawing Sheets

HYDROGEN VENT FOR REMOTE TERMINAL CABINETS

FIELD OF THE INVENTION

The present invention relates to a vent for use with an enclosure, and is particularly concerned with a vent for preventing the buildup of hydrogen gas in a remote terminal cabinet containing digital telephone circuitry.

BACKGROUND OF THE INVENTION

Remote digital terminals used in the telephone industry are generally housed in one of two different types of weatherproof cabinets. One type is sealed from the outside environment and utilizes a heat exchanger of some type to provide cooling for the electronics within the cabinet, and the other type circulates outside air through the electronics for cooling. Batteries are used to provide backup power in remote terminals and must be maintained in a fully charged state. In sealed cabinets, the batteries are usually located inside the cabinet but in a compartment separate from that which contains the electronic equipment itself.

When the battery in a remote terminal cabinet is charged, it produces hydrogen gas. Hydrogen atoms are extremely small and can migrate through even the smallest openings, and hence it is difficult or impossible to maintain the hydrogen gas within the battery compartment. If the hydrogen gas does escape from the battery compartment, its very low density will cause it to collect in the uppermost region of the terminal cabinet and remain there unless it is vented to the ambient atmosphere. Hydrogen gas is highly combustible, and there have been instances in which terminal cabinets have exploded due to excessive concentrations of hydrogen.

In the past, relatively simple venting arrangements have been provided in terminal cabinets to allow hydrogen gas that collects in the upper area of the cabinet to escape to the ambient atmosphere. However, even if the vent is equipped with a weatherproof cover, it is difficult in many cases to prevent water from entering the cabinet through the vent and damaging the electronics. A simple weatherproof cover can prevent ordinary rainfall from entering the vent, but may not be effective against wind-driven rain, splashing from vehicles passing through nearby standing water, runoff from buildings and other adjacent structures, and so on. In these situations, the angle at which the water impinges on the vent may defeat the function of the weatherproof cover, resulting in water infiltration into the cabinet and consequent damage to the electronics.

SUMMARY OF THE INVENTION

A primary object of the present invention is to provide a vent which prevents the buildup of hydrogen gas in a remote terminal cabinet or the like, but which is substantially immune to the entry of water from rainfall and other sources, even under the most adverse conditions.

A further object of the invention is to provide a vent of the type described above in which a small air gap is maintained between a weatherproof cover and the roof of the cabinet on which the vent is installed, with provision for maintaining proper venting even if, due to improper manufacture or installation, the weatherproof cover is inadvertently installed directly against the roof of the cabinet.

The foregoing objects are substantially achieved by providing a vent of the type described with a movable splash guard which prevents the entry of water into the vent by closing off the vent outlet when impinged upon by water or wind. The vent is also provided with a weatherproof cover having downwardly extending side walls that are scalloped to maintain air gaps between the cover and the roof of the cabinet, even if the cover is inadvertently installed directly against the cabinet roof.

In one aspect, the present invention is directed to a vent of the type described which comprises a generally cylindrical body portion adapted to be affixed to the roof of a cabinet. The body portion has a vent inlet for communicating with the interior of the cabinet through an aperture in the cabinet roof, a vent outlet located above the vent inlet and disposed on a cylindrical side surface of the body portion for communicating with the exterior of the cabinet, and an internal air passage communicating between the vent inlet and the vent outlet. An inverted, cup-like cover portion is affixed to an upper end of the body portion for covering the body portion and the vent outlet. The cover portion has downwardly extending, generally cylindrical side walls which extend around the outer periphery of the body portion with a gap therebetween. A splash guard is received in the gap for shielding the vent outlet against the entry of water. The splash guard comprises an upstanding, generally cylindrical collar which surrounds the body portion and is movable laterally between the body portion and the cover portion when impinged upon by wind or water to cover the vent outlet.

In another aspect, a vent for preventing the buildup of hydrogen gas in a remote terminal cabinet or the like comprises means for providing an air passage between the interior of the cabinet and the exterior of the cabinet, with the air passage having a vent outlet on the roof of the cabinet. The vent also comprises an inverted, cup-like cover for covering the vent outlet. The cover has downwardly extending side walls which are scalloped to provide air gaps between the cover portion and the roof of the cabinet.

The present invention is also directed to a method for preventing the entry of water into a remote terminal cabinet or the like through a hydrogen gas vent mounted on the roof of the cabinet. The method comprises the steps of providing the vent with a vent opening and a movable member for covering and uncovering the vent opening, and allowing the movable member to move in response to forces applied by wind, rain or water to cover the vent opening and thereby prevent the entry of water into the cabinet.

BRIEF DESCRIPTION OF THE DRAWINGS

Referring now to the drawings, which form a part of the original disclosure.

DETAILED DESCRIPTION OF THE PREFERRED EMBODIMENT

Figure 1:
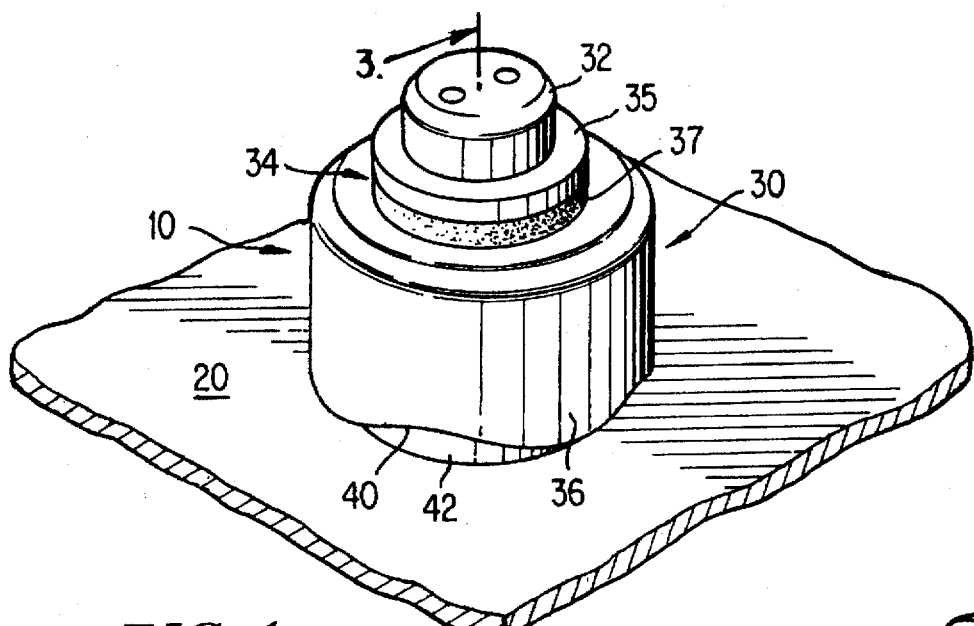
FIG. 1 is a perspective view of a hydrogen gas vent constructed in accordance with a preferred embodiment of the present invention.
Figure 2:
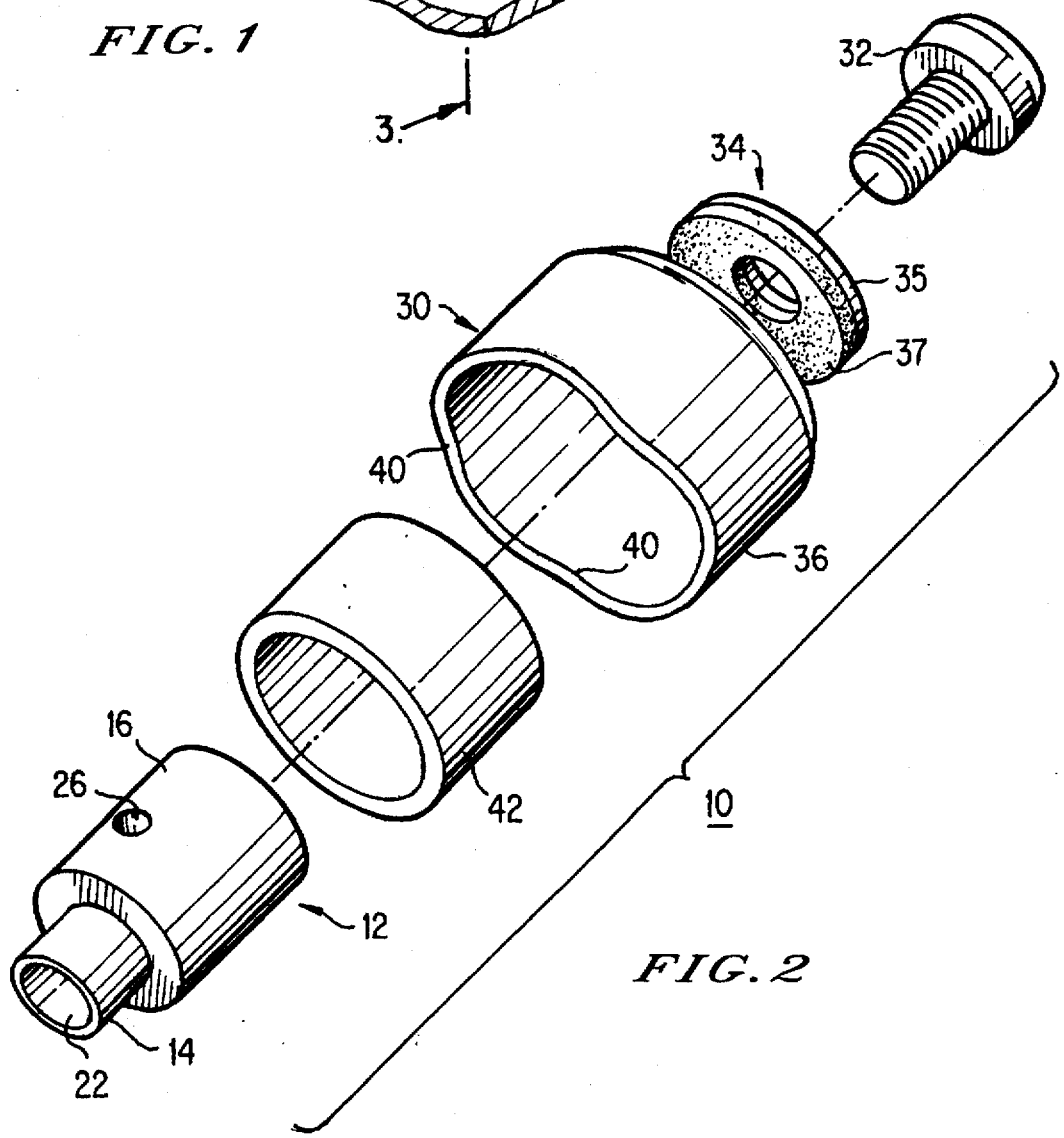
FIG. 2 is an exploded view of the hydrogen gas vent of FIG. 1.
Figure 3:
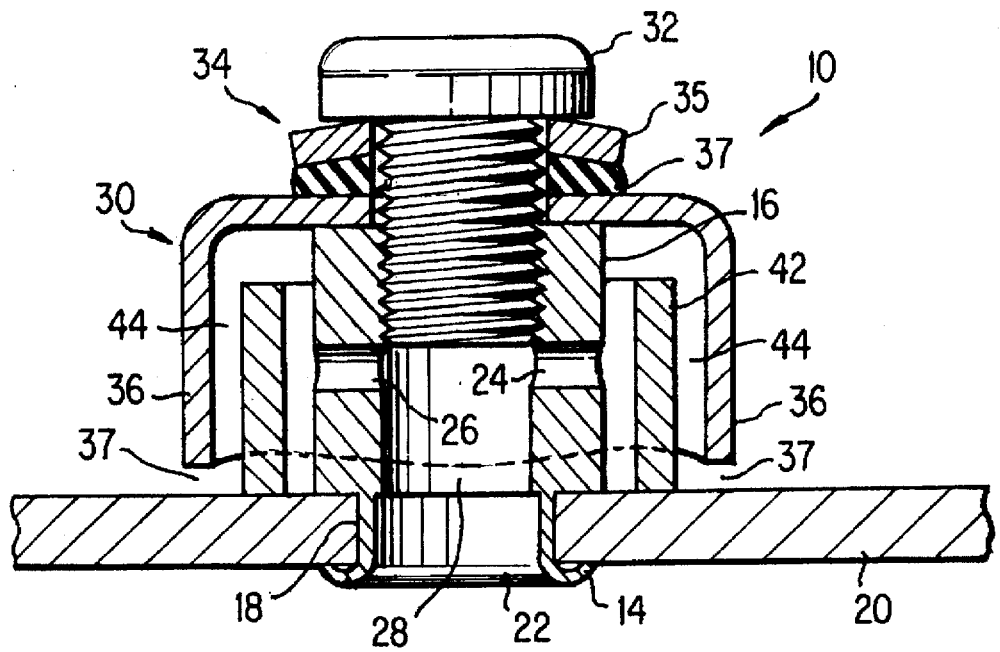
FIG. 3 is a sectional view of the hydrogen gas vent taken along the line 3—3 in FIG. 15
Figure 4:
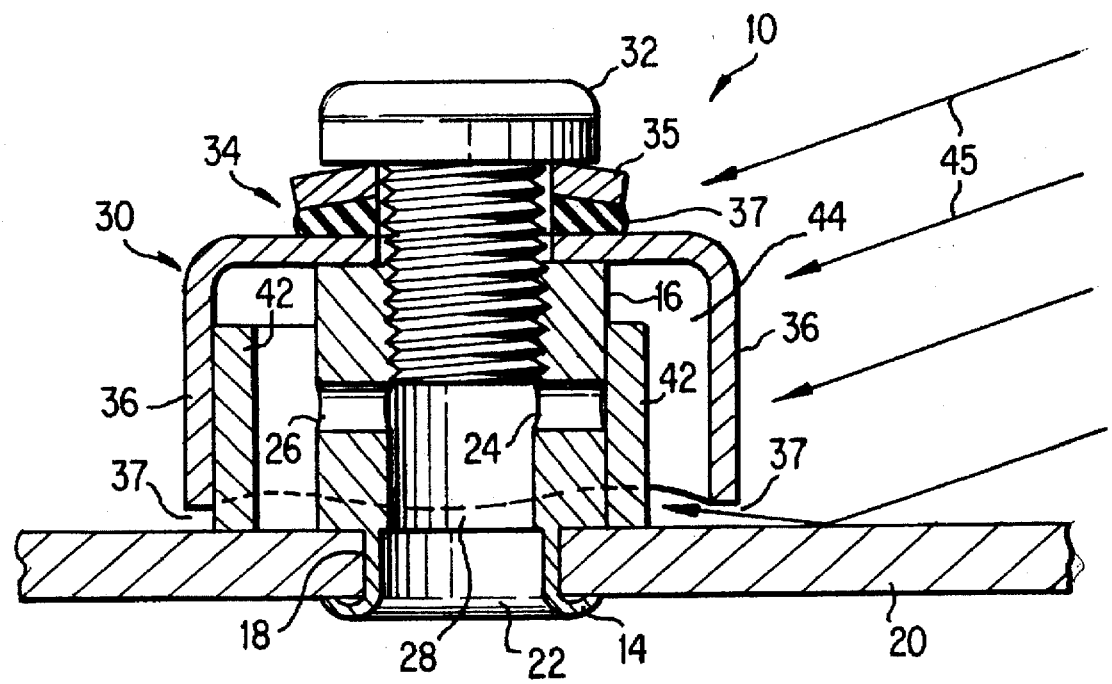
FIG. 4 is a sectional view similar to that of FIG. 3, illustrating the manner in which water is prevented from entering the hydrogen gas vent.

A hydrogen gas vent 10 constructed in accordance with a preferred embodiment of the present invention is illustrated in FIGS. 1–4. The vent 10 includes a hollow, generally cylindrical body portion or post 12 (visible in FIGS. 2–4) which forms the primary supporting structure of the vent 10. The body portion 12 has a stepped configuration at its lower end, as best seen in FIG. 2, with a narrow tubular portion 14 extending downwardly from a somewhat wider main portion 16. The tubular portion 14 is adapted to be received in a correspondingly-dimensioned hole 18 formed vertically through the roof 20 of a remote terminal cabinet, as illustrated in FIGS. 3 and 4, and defines a lower aperture 22 which communicates with the interior of the cabinet to serve as the inlet of the vent 10. Two additional apertures 24 and 26, serving as the outlets of the vent 10, are formed horizontally through the main portion 16 of the vent body 12 above the vent inlet 22, and are located at diametrically opposed positions on the cylindrical side surface of the body 12. An internal air passage 28 within the body 12 connects the vent inlet 22 to the vent outlets 24 and 26, and thus provides a flow path to allow hydrogen gas which has collected below the roof 20 of the cabinet to pass to the ambient environment. The vent 10 will normally be installed at the highest point on the cabinet roof 20, and suitable caulking (not shown) may be provided to insure a watertight seal between the tubular portion 14 of the vent body 12 and the hole 18 in the cabinet roof 20.

In order to provide weather protection for the vent 10, an inverted cup-shaped or bell-shaped cover 30 is affixed to the vent body 12 by means of a tamper-proof screw 32. The screw 32 passes through a sealing washer 34 and engages a threaded portion of the air passage 28 within the body 12, as shown in FIGS. 3 and 4. The sealing washer 34 is of conventional construction and includes an upper metal portion 35 bonded to a lower resilient portion 37. The sealing washer 34 provides a weatherproof seal between the head of the screw 32 and the cover 30 of the vent 10. The cover 30 includes downwardly extending, cylindrical side walls 36 which extend around the outer periphery of the body portion 12 to cover the vent outlets 24 and 26. The cylindrical side walls 36 terminate below the level of the vent outlets 24 and 26 and preferably just above the top exterior surface of the cabinet roof 20, in order to provide an air flow path to the ambient environment while making it difficult for rain to enter the vent outlets 24 and 26.

As best seen in FIGS. 3 and 4, the lower tubular portion 14 of the vent body 12 is rolled or flattened (in much the same manner as a rivet) in the region which protrudes below the interior surface of the cabinet roof 20, in order to physically affix the vent 10 to the roof 20. The main portion 16 of the vent body 12 is dimensioned relative to the cover 30 so that, when the vent 10 is installed in this manner, the lowermost edges of the cylindrical side walls 36 of the cover 30 terminate approximately 1/32 inch above the upper (exterior) surface of the cabinet roof 20. This maintains an air gap 37 between the cover 30 and the roof 20 that is sufficient to allow the desired venting of hydrogen gas, but is small enough to prevent rainwater entry except under extreme conditions. However, it is conceivable that, as a result of errors in manufacturing or installing the vent 10, or as a result of subsequent damage to the vent 10, the gap 37 may be reduced or even eliminated entirely. To account for this possibility, the lower edges of the cylindrical side walls 36 of the cover 30 are provided with scallops or undulations 40, as illustrated in FIGS. 1 and 2. The scallops or undulations 40 assure that air gaps will be maintained between the lower edges of the cylindrical side walls 36 of the cover 30 and the upper surface of the cabinet roof 20, even in the event that the bottom of the cover 30 makes direct contact with the cabinet roof 20.

The vent construction illustrated in FIGS. 1–4 is advantageous in allowing the vent 10 to absorb shocks or impacts without damage. If the cover 30 of the vent 10 receives an off-center impact from the top or side, the resultant twisting or torsional force on the cover 30 about its vertical axis will be absorbed to some extent by the resilient sealing washer 34. If the impact is severe, it will cause one side of the lower edge of the cover 30 to make contact with the cabinet roof 20, thereby resisting the impact and limiting the force applied to the joint between the tubular portion 14 of the vent body 12 and the cabinet roof 20 (which might otherwise cause the vent body 12 to separate from the cabinet roof 20). The scallops or undulations 40 are also advantageous in this regard, since, for a given air gap area, they allow for somewhat earlier contact between the cover 30 and the cabinet roof 20 than would occur if the lower edge of the cover 30 were perfectly flat.

In accordance with an important feature of the present invention, entry of water from rainfall or other sources into the outlets 24 and 26 of vent 10 is further minimized by providing a splash guard 42 as part of the vent structure. As best seen in FIGS. 2–4, the splash guard 42 is preferably provided in the form of an upstanding cylindrical collar which is loosely received in the gap between the outer cylindrical surface of the vent body 12 and the inner surfaces of the cylindrical side walls 36 of the cover 30. The splash guard 42 is freely movable in the gap 44 and simply rests on the upper surface of the cabinet roof 20 without being affixed to the remaining components of the vent 10 or to the cabinet. In this position, the splash guard 42 surrounds the lower portion of the vent body 12, up to a height somewhat above the upper limits of the vent outlets 24 and 26. Thus, the splash guard 42 provides a serpentine flow path for air between the vent outlets 24 and 26 and the ambient environment. Even if the splash guard 42 were fixed, therefore, its placement in this manner would reduce the entry of water into the cabinet interior. However, the ability of the splash guard 42 to move relative to the vent body 12 and cover 30 provides still further protection against water entry, as will now be described in connection with FIG. 4.

With reference to FIG. 4, let it be assumed that water is impinging on the right side of the vent 10 at a shallow angle relative to the horizontal, as indicated by the arrows 45. This may occur, for example, during a hurricane or other rainstorm with strong winds, or as a result of water flowing over the cabinet roof 20 due to splashing, runoff, or cleaning operations. In these situations, the pressure of the water and/or wind impinging on the splash guard 42 through the air gap 37 between the cover 30 and the cabinet roof 20 causes the slash guard 42 to move laterally in the left-hand direction from the position shown in FIG. 3 to that shown in FIG. 4. This brings the right-hand interior cylindrical surface of the splash guard 42 into contact with the right-hand outer cylindrical surface of the vent body 12, thereby closing off the vent outlet 24. As a result, the vent outlet 24 is protected from the entry of water even if the water does succeed in entering the gap 44 between the vent body 12 and the cover 30. At the same time, however, the opposite vent outlet 26 remains open to provide a flow path for the venting of hydrogen gas from the cabinet interior. Because the vent outlet 26 is located on the downstream side of the vent body 12 with respect to the flow direction 45 of the wind and/or water, it is unlikely that water will enter the vent outlet 26 during the period when this vent outlet is open and the opposite vent outlet 24 is closed. However, in the event that the impingement direction of the water or wind reverses, the splash guard 42 will simply shift laterally to a position opposite to that shown in FIG. 4, thereby closing the vent outlet 26 and opening the vent outlet 24. Again, therefore, entry of water into the vent 10 will be prevented.

In a preferred embodiment of the invention, the vent body 12 is made of zinc-plated brass and the cover 30 is made of steel painted to match the color of the cabinet on which the vent 10 is mounted. The splash guard 42 is preferably made of unplated brass. The vent 10 is approximately 0.934 inches in width (corresponding to the outer diameter of the cover 30) and approximately 1 inch in height (measured from the bottom of the rolled-over tubular portion 14 to the top of the screw 32). The vent body 12 has an outside diameter of approximately 0.500 inch and a height of approximately 0.665 inch, with the lower tubular portion 14 (before rolling) accounting for approximately 0.165 inch of the overall height of the vent body 12. The inside diameter of the air passage 28 in the vent body 12 is approximately 0.250 inch, and the vent outlets 24 and 26 are each approximately 0.093 inch in diameter. The cover 30 has a wall thickness of approximately 0.048 inch and a height of approximately 0.500 inch, and is provided with a top hole approximately 0.257 inch in diameter for receiving the screw 32. The splash guard 42 has a height of approximately 0.425 inch, an outside diameter of approximately 0.723 inch, and an inside diameter of approximately 0.625 inch. The inside diameter of the splash guard 42 may be reduced, if desired, to further minimize water intrusion, as long as there is a sufficient gap relative to the vent body 12 to allow for air flow through the vent outlets 24, 26 and lateral movement of the splash guard 42. All dimensions and material specifications given herein are provided merely by way of example, and are not intended to limit the scope of the present invention.

While only one exemplary embodiment has been chosen to illustrate the present invention, it will be understood by those skilled in the art that various modifications can be made therein. For example, the scallops or undulations 40 in the vent cover 30 may have different shapes, and the vent inlet 22 and outlets 24, 26 may be changed in number, location and configuration. It may also be desirable to integrate the functions of the vent cover 30 and the splash guard 42 by mounting the vent cover 30 so that it is laterally movable relative to the vent body 12, thereby simplifying the construction of the vent 10 somewhat. These and other such modifications are intended to fall within the spirit and scope of the invention as defined in the appended claims.

What is claimed is:

1. A vent for preventing the buildup of hydrogen gas in a remote terminal cabinet, comprising:

a generally cylindrical body portion adapted to be affixed to a roof of a cabinet, said body portion having a vent inlet for communicating with the interior of the cabinet through an aperture in the cabinet roof, a vent outlet located above said vent inlet and disposed on a cylindrical side surface of said body portion for communicating with the exterior of said cabinet at a point above the cabinet roof, and an internal air passage communicating between said vent inlet and said vent outlet;

an inverted cup-like cover portion affixed to an upper end of said body portion for covering said body portion and said vent outlet, said cover portion having downwardly extending, generally cylindrical side walls which extend around an outer periphery of said body portion with a gap therebetween; and a splash guard received in said gap for shielding said vent outlet against the entry of water, said splash guard comprising an upstanding, generally cylindrical collar which surrounds said body portion and is movable laterally between said body portion and said cover portion when impinged upon by wind or water to cover said vent outlet.

2. A vent as claimed in claim 1, wherein said vent outlet is one of at least two vent outlets formed at circumferentially spaced locations on the cylindrical side surface of said body portion.

3. A vent as claimed in claim 2, wherein said at least two vent outlets are formed at diametrically opposed locations on the cylindrical side surface of said body portion.

4. A vent as claimed in claim 1, wherein said splash guard is adapted to rest on the roof of said cabinet.

5. A vent as claimed in claim 1, wherein said downwardly extending side walls of said cover portion are scalloped to provide air gaps between said cover portion and the roof of said cabinet.

6. A vent as claimed in claim 1, wherein said body portion has a stepped lower end for attachment to the roof of said cabinet, said stepped lower end comprising a first part having said vent inlet formed therein and adapted to pass through an aperture formed in said roof, and a second part wider than said first part for resting on an exterior surface of said roof.

7. A vent as claimed in claim 6, wherein said cover portion provides an air gap between the downwardly extending side walls thereof and the exterior surface of said roof when said second part of said body portion is in contact with the exterior surface of said roof.

8. A vent as claimed in claim 1, wherein said cover portion is affixed to said body portion by means of a screw passing through said cover portion and engaging a threaded hole in said body portion.

9. A vent as claimed in claim 8, wherein said threaded hole communicates with said air passage, and further comprising a sealing washer for providing a seal between said screw and said cover portion.

10. A vent for preventing the buildup of hydrogen gas in a remote terminal cabinet, comprising:

means for providing an air passage between the interior of said cabinet and the exterior of said cabinet, said air passage having a vent outlet on a roof of said cabinet for communicating with the exterior of said cabinet; and an inverted cup-like cover for covering said vent outlet, said cover having a closed top and downwardly extending side walls which are scalloped to provide air gaps between said cover and the roof of said cabinet.

11. A vent as claimed in claim 10, wherein said means for providing said air passage comprises a vent body adapted to be affixed to the roof of said cabinet, said vent body having a vent inlet for communicating with the interior of the cabinet through an aperture in the cabinet roof, said vent outlet being located above said vent inlet and communicating with said vent inlet through said air passage.

12. A vent as claimed in claim 11, wherein said vent body and said cover are both generally cylindrical, and wherein the downwardly extending side walls of said cover extend around an outer periphery of said vent body with a gap therebetween for allowing said vent outlet to communicate with the exterior of said cabinet.

13. A vent as claimed in claim 12, wherein said vent outlet is formed in a cylindrical side surface of said vent body.

14. A vent as claimed in claim 13, wherein said vent outlet is one of at least two vent outlets formed at circumferentially spaced locations on the cylindrical side surface of said vent body.

15. A vent as claimed in claim 14, wherein said at least two vent outlets are formed at diametrically opposed locations on the cylindrical side surface of said vent body.

16. A vent as claimed in claim 11, wherein said vent body has a stepped lower end for attachment to the roof of said cabinet, said stepped lower end comprising a first part having said vent inlet formed therein, and a second part wider than said first part for resting on an exterior surface of said roof.

17. A vent as claimed in claim 11, wherein said cover is affixed to said vent body.

18. A vent as claimed in claim 17, wherein said cover is affixed to said vent body by means of a screw passing through said cover and engaging a threaded hole in said vent body, said threaded hole communicating with said air passage, and further comprising a sealing washer for providing a seal between said screw and said cover.

19. A method for preventing the entry of water into a remote terminal cabinet through a hydrogen gas vent mounted on a roof of said cabinet, comprising the steps of:

providing said vent with a first vent opening and a movable member for covering and uncovering said first vent opening;

allowing said movable member to move in response to forces applied by wind, rain or water to cover said first vent opening and thereby prevent the entry of water into said cabinet.

20. A method as claimed in claim 19, further comprising the steps of:

providing said vent with a second vent opening facing in a direction different from that of said first vent openings; and allowing said second vent opening to remain open when said first vent opening is covered by said movable member.

* * * * *